United States Patent
Ravi

[19]

[11] Patent Number: 5,812,362

[45] Date of Patent: Sep. 22, 1998

[54] METHOD AND APPARATUS FOR THE USE OF DIAMOND FILMS AS DIELECTRIC COATINGS ON ELECTROSTATIC CHUCKS

[75] Inventor: Kramadhati Ravi, Atherton, Calif.

[73] Assignee: Applied Materials, Inc., Santa Clara, Calif.

[21] Appl. No.: 663,495

[22] Filed: Jun. 14, 1996

[51] Int. Cl.$^6$ ............................................. H02N 13/00
[52] U.S. Cl. ............................................. 361/234; 279/128
[58] Field of Search ................................. 361/230, 233, 361/234, 235; 279/128; 29/825, 829

[56] References Cited

U.S. PATENT DOCUMENTS

| | | | |
|---|---|---|---|
| 4,551,192 | 11/1985 | Di Milla et al. | 156/345 |
| 4,981,717 | 1/1991 | Thaler | 427/53.1 |
| 5,013,693 | 5/1991 | Guckel et al. | 437/248 |
| 5,166,856 | 11/1992 | Liporace et al. | 361/233 |
| 5,283,087 | 2/1994 | Yamazaki et al. | 427/577 |
| 5,397,428 | 3/1995 | Stoner et al. | 117/86 |
| 5,411,758 | 5/1995 | Simpson | 427/8 |
| 5,413,360 | 5/1995 | Atari et al. | 361/234 |
| 5,431,968 | 7/1995 | Miller et al. | 427/577 |
| 5,436,790 | 7/1995 | Blake et al. | 361/234 |
| 5,463,526 | 10/1995 | Mundt | 361/234 |
| 5,548,470 | 8/1996 | Husain et al. | 361/234 |

OTHER PUBLICATIONS

Singer, "Electrostatic Chucks in Wafer Processing," Semiconductor International, Apr. 1995, pp. 57–64.
GPI WeB Client Japanese Abstracts of Chikuno, 06–107494, Apr. 19, 1994 and Kikuchi, 05–144929, Jun. 11, 1993.

*Primary Examiner*—Fritz Fleming
*Attorney, Agent, or Firm*—Townsend and Townsend and Crew LLP

[57] ABSTRACT

An electrostatic chuck for supporting substrates in a substrate processing chamber during processing. The chuck includes a diamond layer that overlies an electrically conductive element. The chuck has increased clamping force and improved resistance to etching. In one embodiment, the diamond layer is an insulating layer while in another it is a conducting layer with uniform surface roughness.

23 Claims, 5 Drawing Sheets

METHOD AND APPARATUS FOR THE USE OF DIAMOND FILMS AS DIELECTRIC COATINGS ON ELECTROSTATIC CHUCKS

CROSS-REFERENCE TO RELATED APPLICATIONS

This application is related to the concurrently filed patent application entitled "USE OF CARBON-BASED FILMS IN EXTENDING THE LIFETIME OF SUBSTRATE PROCESSING SYSTEM COMPONENTS," having K. V. Ravi listed as inventor. The above referenced application is assigned to Applied Materials, Inc., the assignee of the present invention, and is hereby incorporated by reference.

BACKGROUND OF THE INVENTION

The present invention relates to electrostatic chucks (ESCs) employed in substrate processing equipment. More specifically, the present invention relates to an improved ESC that has an upper surface resistant to attack from gaseous species and plasma constituents used during various substrate processing operations and that is capable of clamping a substrate with increased force.

Substrate processing systems are sensitive to unwanted substrate movement during loading, unloading and processing. For example, if not held firmly by the chuck during loading and unloading, a substrate may become lodged in the processing system. This scenario could occur where a substrate, centered on the chuck when loaded, moves off-center during processing. Upon unloading, the substrate may strike part of the processing chamber, such that the substrate shatters. Even if the substrate is not shattered, the operator will probably have to halt operations and open the vacuum chamber to remove the errant substrate, resulting in costly downtime. Motion during processing can also cause non-uniformity in the layer(s) being deposited or etched, due to the thermal nonuniformities which can result from substrate motion. This is especially critical with larger substrates (e.g., 12 inch diameter substrates), because substrate rigidity decreases as area increases. Furthermore, firm, uniform contact must exist between the chuck and the substrate being processed to maintain uniform thermal transfer. Areas of the substrate which do not contact the chuck risk becoming hot spots, thereby adversely affecting yield. A strong, uniform clamping force between the substrate and the chuck is therefore desirable.

One method of holding a substrate securely in place during processing is the use of an electrostatic chuck (ESC). ESCs generate an electrostatic (or coulomb) force between the ESC and substrate to secure the substrate to the ESC. Fabrication of some ESCs typically involves machining a process-compatible metal, such as aluminum, into a suitable support pedestal and grit blasting the top surface of the pedestal. A layer of dielectric material is then applied to the pedestal's upper surface and ground to a smooth, planar surface for supporting the substrate.

During substrate processing, a voltage is applied between the substrate and the metal pedestal, creating positive charge on one side of the dielectric layer and negative charge on the other side. This charge generates an attractive, substantially uniform coulomb force between the substrate and pedestal that clamps the substrate in place.

The clamping force of an ESC (i.e., the force with which a substrate is held in place on the ESC) can be expressed as follows:

$$F = \frac{CV^2}{2D} \quad (1)$$

where F is the clamping force, C is the capacitance of a dielectric between two conductors (represented here by a coating situated between the ESC's pedestal and the substrate), V is the voltage applied to the ESC and D is the distance between the capacitor plates (the thickness of the dielectric).

The clamping force may be maximized in several different ways. First, coatings with higher dielectric constants (i.e., relative permittivity, $\epsilon_r$) may be employed. This increases the clamping force (Equation (1)) by increasing the capacitance, which is given by the equation for the capacitance of two parallel plates separated by a dielectric:

$$C = \frac{A\epsilon_0\epsilon_r}{D} \quad (2)$$

where A is the area in square meters of one of the plates, D is the distance in meters between the plates, $\epsilon_0$ is the permittivity of empty space, and $\epsilon_r$ is the relative permittivity of the dielectric material between the plates. Second, a thinner dielectric coating may be applied, reducing D in both equations. This can increase clamping force substantially because clamping force is inversely related to the square of the distance between the ESC and substrate. Finally, the voltage applied between the pedestal and the substrate may be increased. Since the amount of force exerted on the substrate is related to the square of the applied voltage, increasing the applied voltage can also have a substantial effect. However, the coating must possess a sufficiently high dielectric breakdown voltage to withstand the increased voltage.

Some common ESCs are manufactured from aluminum or stainless steel and coated with plasma- or thermal-sprayed aluminum oxide ($Al_2O_3$). While these substances have been used to fabricate ESCs, improved characteristics would be welcome. Additionally, the problem of "back side particles" may be encountered with ceramic-coated pedestals. Such particles may be generated when the substrate contacts or scrapes the ESC's ceramic-coated surface. The contact may cause ceramic material to flake off, generating unwanted particles and contaminants that may adversely affect wafer yield.

The processing of substrates requires a carefully controlled environment to avoid contamination from ambient chemical species and defects caused by particulates. Many substrate processing steps therefore take place in the controlled environment of a processing chamber and include operations such as deposition, etching, sputtering and diffusion. Each of these operations serves a function in the production of a finished substrate, such as applying, patterning and manipulating the characteristics of the various layers required by the given technology. Etching of components, such as the pedestal upon which the substrate rests, is most severe during etching and chamber cleaning procedures (which may be required as frequently as every one to three substrates).

For example, chamber cleaning procedures are often performed periodically in deposition systems. As a film is deposited on a substrate, some of the material being deposited also accumulates on the processing chamber's surfaces and must be removed periodically. During such cleaning procedures, process gases are evacuated from the processing chamber and an etchant such as $CF_4$ or $NF_3$ is introduced. A plasma is then formed in order to etch away residues accumulated on the processing chamber's interior.

If possible, surfaces exposed to these etchants should be protected to lower operating costs and increase throughput. For example, contemporary substrate processing techniques employ a dummy substrate during cleaning procedures to protect the pedestal's upper surface. This operation entails loading, positioning and subsequently removing the dummy substrate. In a situation requiring maximum throughput, as does the semiconductor fabrication business, shuttling protective devices in and out of processing systems wastes valuable time. The use of dummy substrates is also costly, since some dummy substrates only survive about ten cleaning cycles before requiring replacement. The possibility of the dummy substrate jamming during loading and unloading also exists, which can create problems as previously described.

Accordingly, it is desirable and advantageous to reduce movement of the substrate being processed and to provide uniform thermal conditions across the substrate. The level of back side particulates should also be reduced to the extent possible. Finally, obviating the need for a dummy substrate is desirable because it reduces consumable costs over the lifetime of the substrate processing system and increases throughput.

SUMMARY OF THE INVENTION

The present invention addresses these requirements by coating the upper surface of the electrostatic chuck (ESC) with a diamond coating. The diamond-coated ESC of the present invention provides increased clamping force on a substrate being processed. The increased clamping force reduces movement of the substrate during processing and provides more uniform thermal conditions across the substrate. The diamond coating is resistant to etching from gaseous reactants, by-products and plasma constituents that are commonly employed or produced during substrate processing or chamber cleaning. Thus, the present invention obviates the need to use a dummy substrate, which, in turn, results in reduced consumable costs and increased throughput. Additionally, the diamond coating used in the present invention resists flaking, thereby reducing levels of back side particulates. The diamond-coated ESC of the present invention provides these and other advantages and can be fabricated in a simple and cost-effective manner.

In one embodiment of the ESC of the present invention, an upper surface of an electrically conductive pedestal is coated with an insulating diamond coating. Preferably, the diamond coating is relatively flat and smooth to maximize the electrostatic clamping force and heat transfer.

In another embodiment of the ESC of the present invention, an upper surface of a pedestal is coated with a diamond coating doped with a dopant such as boron. The doped coating exhibits increased conductance, which allows the ESC to take advantage of the Johnson-Rahbek (J-R) effect. The J-R effect increases clamping force by reducing the dielectric thickness to the size of the microscopic gaps between the coating and substrate. Preferably, the upper surface of the doped diamond coating possesses a certain degree of uniform roughness to further exploit the Johnson-Rahbek effect.

In still another embodiment, the present invention provides a method for fabricating a pedestal for supporting a substrate. The pedestal is formed by a process that includes the steps of machining a first silicon billet to form a lower component of the pedestal having coolant channels machined in a top surface. A second silicon billet is also machined to form an upper component of the pedestal. The two pieces are then diffusion bonded together to form the pedestal. Optionally, a diamond film is deposited over an upper surface of the diffusion-bonded pedestal.

A further understanding of the nature and advantages of the present invention may be realized by reference to the remaining portions of the specification and the drawings.

DETAILED DESCRIPTION OF THE PREFERRED EMBODIMENTS

I. An Exemplary High Density Plasma CVD System

Figure 1:
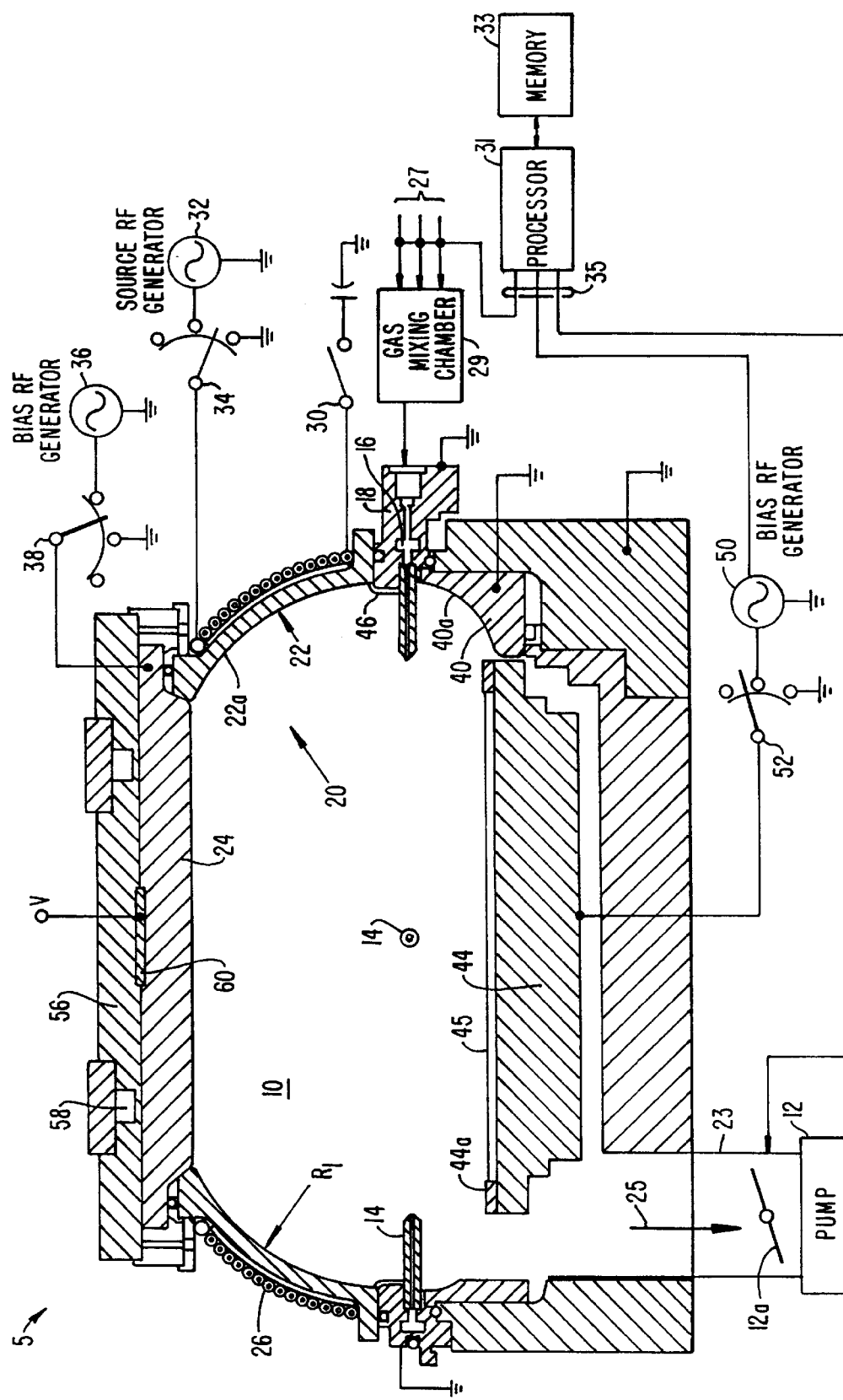
FIG. 1 is a vertical, cross-sectional view of one embodiment of a simplified substrate processing apparatus in which the present invention may be employed.

FIG. 1 illustrates one embodiment of a high-density plasma chemical vapor deposition (HDP-CVD) system 5 in which the ESC of the present invention may be employed. HDP-CVD system 5 includes a vacuum chamber 10, a vacuum pump 12, a source RF (SRF) generator 32, a bias RF (BRF) generator 36, a BRF generator 50 and a pedestal 44.

Vacuum chamber 10 includes a ceiling 20 consisting of a sidewall 22 and a disk-shaped ceiling electrode 24. Sidewall 22 is made of an insulator such as quartz or ceramic and supports coiled antenna 26. The structural details of coiled antenna 26 are disclosed in U.S. patent application Ser. No. 08/113,776 entitled "High Density Plasma CVD and Etching Reactor," by Fairbain and Nowak, filed Aug. 27, 1993, the disclosure of which is incorporated herein by reference.

Deposition gases and liquids are supplied through lines 27, having control valves (not shown), into a gas mixing chamber 29 where they are combined and sent to a gas supply ring manifold 16. Gas injection nozzles 14 are coupled to gas supply ring manifold 16 and disperse deposition gases introduced into manifold 16 to a substrate 45 resting on pedestal 44 within chamber 10. Pedestal 44 restrains the substrate during processing and may also contain cooling passages and other features.

Gas supply ring manifold 16 is positioned within a housing 18. Housing 18 is protected from reactants by a skirt 46. Skirt 46 is composed of a material, such as quartz, ceramic, silicon or polysilicon, which is resistant to the reactants used in the HDP-CVD process. The bottom of vacuum chamber 10 may include an annular liner 40, which itself may be made removable.

An inductively coupled plasma of the deposition gases can be formed adjacent to substrate 45 by RF energy applied to coiled antenna 26 from SRF generator 32. SRF generator 32 can supply either single or mixed frequency RF power (or other desired variation) to coiled antenna 26 to enhance the decomposition of reactive species introduced into vacuum chamber 10. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56. Lid 56 is cooled by cooling jackets 58, but ceiling electrode 24 can be heated by a resistive heater 60 to accelerate cleaning rates or alter process parameters. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50 or left unconnected (allowed to float), by properly setting switch 52. The settings of these switches depends upon the plasma's desired characteristics. BRF generators 36 and 50 can supply either single or mixed frequency RF power (or other desired variation). BRF generators 36 and 50 may be separate RF generators, or may be a single RF generator connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increasing the gap-fill capability of a film).

Capacitive coupling may also be used to form the plasma separately from, or in conjunction with, the formation of an inductively coupled plasma. Such a plasma may be formed between coiled antenna 26 and either ceiling electrode 24 or pedestal 44. A capacitively coupled plasma also may be formed between ceiling electrode 24 and pedestal 44 in a similar fashion. Together, these methods allow the formation of a capacitively coupled plasma in three different ways.

BRF generators 36 and 50, SRF generator 32, throttle valve 12a, the control valves connected to lines 27, switches 30, 34, 38 and 52 and other elements in HDP-CVD system 5 are all controlled by a processor 31 over control lines 35, only some of which are shown. Processor 31 operates under the control of a computer program stored in a memory 33. The computer program dictates the timing, mixture of gases, chamber pressure, RF power levels and other parameters of a particular process.

An example of such an HDP-CVD apparatus, along with the details of each of the three capacitively coupled configurations and the specific details concerning the inductively coupled configurations, is described in U.S. patent application Ser. No. 08/234,746 entitled "High Density Plasma CVD Reactor with Combined Inductive and Capacitive Coupling," filed Apr. 26, 1994, the disclosure of which is incorporated herein by reference.

The above description is mainly for illustrative purposes and should not be considered as limiting the scope of the present invention. Variations of the above-described system, such as variations in chamber design, location of RF power connections and other variations are possible. Additionally, the present invention is useful in substrate processing equipment such as electron cyclotron resonance (ECR) plasma CVD devices, thermal CVD devices, etch devices and sputter deposition devices, among others. The apparatus of the present invention is not limited to any specific substrate processing apparatus.

II. Diamond Coating of ESCs

The present invention provides a diamond-coated ESC that can be used to secure a substrate during processing in a variety of substrate processing chambers. For example, the diamond-coated ESC of the present invention can be used as pedestal 44 in the HDP-CVD system of FIG. 1. The diamond coated ESC of the present invention is resistant to etching from gaseous reactants and by-products that are present during common substrate processing operations and provides increased clamping force to the substrate being processed along with other benefits as described in more detail below.

Figure 2:
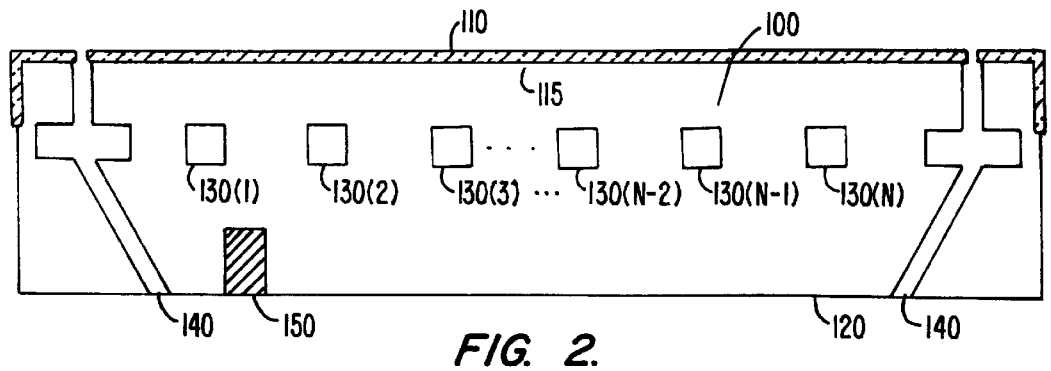
FIG. 2 is a vertical, cross-sectional view of one embodiment of a simplified, diamond-coated ESC according to the present invention.

FIG. 2 illustrates one embodiment of a diamond coated ESC 100 according to the present invention that can be used as pedestal 44. As shown in FIG. 2, a diamond coating 110 is applied to at least an upper surface 115 of a pedestal 120 such that the substrate contacts the diamond coating when the substrate is secured on the ESC during processing. Diamond coating 110 may also be applied to other parts of pedestal 120 such as its sides and lower portion.

Pedestal 120 includes coolant channels 130(1)–130(N) that supply a liquid cooling medium to transfer heat out of diamond-coated ESC 100 and gas channels 140 that supply gas to the substrate's underside to promote uniform temperature across the substrate during processing. Pedestal 120 is at least partially made of an electrically conductive material such as molybdenum, silicon carbide, silicon nitride or aluminum nitride. An electrical contact 150 is provided to allow the application of a clamping voltage between pedestal 120 and the substrate.

Diamond coating 10 provides pedestal 120 with an extremely hard and strong upper surface. The hardness and other physical and electrical properties of diamond surface 110 along with the structure of ESC 100 provide ESC 100 with numerous advantages as compared to prior art ESCs.

For one, contaminants and deposits will not readily nucleate on the surface of diamond coating 110 due to its high surface energy level. Also, the hardness and structure of the diamond coating protects against the generation of back side particles. The diamond surface is highly resistant to flaking and chipping. Thus, such particles are less likely to be produced when a substrate is brought into contact with the ESC of the present invention during a wafer loading or unloading operation.

The diamond-coated ESC of the present invention is also highly resistant to attack (etching) from gaseous species and by-products as well as plasma constituents which are all commonly employed or generated during various substrate processing operations. For example, diamond coating 110 is resistant to attack by molecular and atomic oxygen, molecular and activated etch gases (such as $NF_3$, $CF_4$, $ClF_3$ and $F_2$ among others), and other process gases commonly used in substrate processing at temperatures of up to about 600° C. or more. Diamond coating 110 is also resistant to attack by constituents from a plasma formed from the gases listed above and/or from other gases.

Such improved etch resistance results in ESC 100 enjoying greater reliability and a longer component lifetime in comparison to ESCs coated with other dielectrics such as ceramic or quartz. Many current ESCs are protected by use of a dummy silicon substrate during chamber cleaning operations as described above. The diamond-coated ESC according to the present invention does not require such protection. This, in turn, results in reduced consumable costs and increased throughput because it is unnecessary to load and unload a dummy substrate into the chamber for clean operations. Also avoided are possible problems with the dummy substrate jamming in the substrate processing system.

Materials used to coat many prior art ESCs (e.g., $Al_2O_3$) are often polar, retaining charge when an applied electrical field is removed (e.g., to de-clamp the substrate). This can result in the substrate sticking to the ESC. Such sticking can waste valuable processing time and can result in the substrate scraping against the ESC's upper surface upon removal thereby producing back side particles. Diamond coating 110 is not polar and therefore will not retain charge when the applied electric field is removed. Thus, ESC 100 can be rapidly de-clamped to increase throughput while reducing the likelihood of back side particle generation.

Diamond-coated ESC 100 also exhibits improved thermal properties as compared to prior art ESCs. Diamond has a thermal conductivity of 200 W/m–K as compared to thermal conductivities of 10.4 W/m–K for $Al_2O_3$, 0.004 W/m–K for $SiO_2$, 25 W/m–K for $Si_3N_4$ and 32 W/m–K for AlN. The high thermal conductivity of diamond coating 110 facilitates heat spreading and thus improves thermal uniformity. Thermal uniformity is also improved by the higher clamping force exerted on the substrate in the preferred embodiments of the present invention. The details of the increased clamp force differ depending on the embodiment of the present invention and are discussed in more detail below.

Some presently-manufactured ESCs introduce helium or another heat transfer gas beneath the substrate being processed. The thermal transfer characteristics of the introduced helium help ensure better thermal transfer between the ESC and substrate. This is particularly important in areas where the substrate is not in firm contact with the ESC. Without good thermal transfer, hot-spots can develop on the substrate leading to reduced yield. The increased clamping force helps maintain firm contact between the ESC and substrate and enables the use of higher back side helium pressures during processing. At such increased pressure levels, more helium can be circulated under the substrate thereby minimizing the occurrence of such hot-spots.

A. Deposition of Diamond Coating 110

Diamond coating 110 can be deposited over pedestal 120 in a variety of ways. For example, a CVD process such as Plasma-Enhanced CVD (PECVD) or hot filament CVD (HFCVD) may be used. In such a process, the pedestal is placed in the PECVD or HFCVD chamber and process gases such as $CH_4$ and $H_2$ are introduced into the chamber. In an HFCVD system these process gases are directed at heated filaments situated above the pedestal to be coated. Electrons emitted by the heated filaments ionize the process gases as they pass over the filaments before impinging on the pedestal's surface to deposit a diamond film over the pedestal. Passages in pedestal 120 covered by diamond coating 110 can be opened by a method such as laser drilling. Once completed, the pedestal is installed in a desired substrate processing system in the normal manner.

Deposition methods such as PECVD and HFCVD allow the thickness of diamond coating 110 to be precisely controlled and allow it to be deposited to a thicknesses of less than 1 $\mu$m over materials such as silicon, molybdenum and various ceramic materials. In preferred embodiments of the present invention, coating 110 is deposited to a thickness of between about 5 $\mu$m and 50 $\mu$m.

The solubility and diffusion of impurities or contaminants in diamond coating 110 according to any of the above methods are negligible. The low impurity level and diffusion properties of diamond coating 110 also result in only negligible amounts of contaminants diffusing through the coating. As a consequence, substrate processing systems employing the ESC of the present invention enjoy environments inherently cleaner than those of currently available systems. To help ensure this low impurity diffusion rate, it is preferable to apply diamond coating 110 at temperature in excess of 700° C. and in the presence of a high concentration of atomic hydrogen. At such temperatures and in the presence of atomic hydrogen the coating does not absorb device-damaging impurities such as alkali metals and heavy metals. Diamond coating 110 also functions as a barrier to the diffusion of impurities residing in pedestal 120 toward the substrate and processing chamber.

As an added benefit of the present invention, existing ESCs can be retrofitted to include a diamond-coated surface layer such as diamond coating 110. The diamond layer may be deposited directly over an existing dielectric layer of the old ESC or the old dielectric layer may be mechanically or chemically removed as appropriate. If the existing layer is not removed some of the benefits of the ESC of the present invention will not be fully realized, e.g., clamping force will not be increased because of the overall thickness of two insulating layers, but other benefits such as a reduction in contaminants and increased resistance to etching will still result.

In different embodiments of the ESC of the present invention, diamond coating 110 is either an insulation layer or a conductive layer as described in more detail below.

B. An Embodiment Where Diamond Coating 110 is an Insulating Layer

In one embodiment of the present invention, ESC 100 is coated with an insulating (undoped) diamond coating 110. To clamp a substrate to ESC 100, a voltage is applied between the substrate and pedestal 120. This voltage creates a positive charge on one side of diamond coating 110 and a negative charge on the other side, with diamond coating 110 acting as a dielectric layer. This charge differential generates an attractive, substantially uniform, electrostatic force between the substrate and pedestal 120, clamping the substrate to diamond coating 110.

In this embodiment, diamond coating 110 may be deposited as described above. No dopants or other such gases are added to the process gas. This undoped diamond layer has an increased breakdown voltage (100 V/$\mu$m) as compared to other materials commonly used as the upper insulating layer of an ESC. For example, the breakdown voltage of $Al_2O_3$ is 10 V/$\mu$m, the breakdown voltage of $SiO_2$ is between 15–59 V/$\mu$m, the breakdown voltage of $Si_3N_4$ is between 2–24 V/$\mu$m and the breakdown voltage of AlN is between 14–17 V/$\mu$m.

Because of the increased breakdown voltage, the ESC of this embodiment is able to tolerate higher applied voltages than ESCs insulated with any of the materials listed above. As indicated by Equations 1 and 2, clamping force is related to the square of the applied voltage. Thus, an increase in the applied voltage can cause a substantial increase in clamping force, resulting in less substrate motion and improved thermal transfer.

As described above, the thickness of the deposited insulating diamond layer can also be precisely controlled so that coating 100 may be deposited more thinly than other dielectric coatings. Preferably, diamond coating 110 is deposited to a thickness of between about 5 $\mu$m to 50 $\mu$m. This thickness is considerably thinner than the 200 $\mu$m to 300 $\mu$m thicknesses used for some ESC coatings, such as aluminum oxide ($Al_2O_3$). Diamond coating 110 may be deposited more thinly than other ESC coatings because diamond can be deposited using a CVD process.

The clamping force exerted on a substrate is inversely related to the square of the dielectric layer's thickness (D, from Equations 1 and 2). Thus, the thinner coating used in the present invention increases the clamping force applied to the substrate. Additionally, the use of a thinner coating eliminates the need for the post-deposition lapping and polishing that some ESCs require (such as those coated with $Al_2O_3$), thus reducing manufacturing costs.

The clamping force in this embodiment can be further increased by ensuring that diamond coating 110 is deposited as smoothly and as flatly as possible. This maximizes the clamping force (by avoiding areas where diamond coating 110 and the substrate are not in contact with one another) and also maximizes heat transfer (by ensuring maximum contact between the ESC and substrate). Smooth, flat diamond coatings can be obtained by increasing the nucleation density of diamond on the electrostatic chuck's surface. One approach to increasing the nucleation density is to create a high density of surface damage sites on the chuck's surface prior to diamond deposition. This can be done by mechanical abrasion or the use of ultrasonic techniques.

C. An Embodiment Where Diamond Coating 110 is a Conducting Layer

In another embodiment of the present invention, a diamond coating 110 is doped with boron or a similar dopant to increase the ESC's clamping force according to the Johnson-Rahbek effect. The doping changes the electrical properties of diamond coating 110 such that the coating is no longer an insulator and is instead a semiconductor. The doping can be performed, for example, by adding diborane ($BH_3$) to the process gas during the PECVD, HFCVD or other process used to deposit diamond coating 110 over pedestal 120. Of course other dopant sources and other dopants may also be used. For example, $B_2O_3$ (among others) may also be used as a boron dopant source. The preferred range of conductivity of the boron-doped diamond coating is $3\Omega$-cm to $50\Omega$-cm.

In this embodiment, the upper surface of diamond coating 210 preferably has a uniform surface roughness and exhibits a variation in height of about 2.5 $\mu$m or less. This surface roughness maximizes the clamping force according to the Johnson-Rahbek effect. As described below in respect to FIG. 3, the Johnson-Rahbek (J-R) effect depends on the formation of contact points between the conductive coating and substrate, with small gaps therebetween. Clamping force is increased by reducing the distance D in Equations 1 and 2. Instead of representing the distance between the ESC and substrate (i.e., the thickness of diamond coating 210), D is reduced to the average gap-size, as explained below. The thickness of diamond coating 210 thus becomes less critical because the coating's roughness, not its thickness, determines the clamping force generated.

Figure 3:
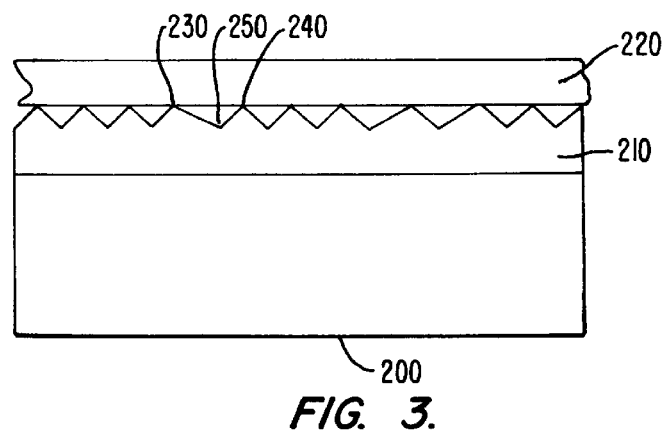
FIG. 3 is a vertical, cross-sectional view of a second embodiment of a simplified, diamond-coated ESC according to the present invention.

FIG. 3 is a vertical, cross-sectional view of a portion of an embodiment of a diamond-coated ESC according to the present invention that exploits the Johnson-Rahbek effect to increase the clamping force applied to a substrate. In FIG. 3, an ESC pedestal 200 is coated with a doped diamond coating 210. The upper surface of diamond coating 210 has a uniform roughness that results in numerous contact points between coating 210 and a substrate 220. Such contact points are illustrated in FIG. 3 as contact points 230 and 240. Charge applied to pedestal 200 is transferred to coating 210 and leaks at the contact points, such as contact points 230 and 240. Between contact points 230 and 240 lies a gap 250 (one of numerous such gaps between doped diamond coating 210 and substrate 220). Due to the charge leakage, the potential at contact points 230 and 240 is near zero. In contrast, the electric field in gap 250 is extremely high. All sides of gap 250 thus experience a coulomb force toward the center of gap 250. The variable D in Equations 1 and 2 (the distance between capacitor plates) is reduced from the thickness of diamond coating 210 to the size of gap 250. Depending on the average size of the gaps, D will be on the order of about 0.1 $\mu$m to 2.0 $\mu$m, leading to large clamping forces.

The degree of surface roughness in diamond coating 210 may be controlled by varying parameters such as the concentration of $H_2$ (in a $CH_4$, $H_2$ and diborane process gas) or the deposition temperature during deposition of the coating. For example, decreasing the concentration of $H_2$ in the $CH_4/H_2$/diborane mixture results in the deposited coating having a rougher surface. Increasing deposition temperature can also provide a rougher surface. At a low temperature (e.g., about 600° C.), deposition of the coating is relatively slow, and a relatively smooth surface results. At a high temperature (e.g., about 1100° C.), formation of the coating proceeds swiftly, yielding a rough surface. Surface roughness can be measured by surface profilometry. The optimum surface roughness for maximum clamping force is determined experimentally.

Most heat transfer occurs at the contact points. Thus, the high thermal conductivity of coating 210 (between about 100 to 200 w/m-K) is particularly beneficial here. Heat transfer is also increased because of the increased clamping force applied to substrate 220. The combination of these factors minimizes temperature gradients in substrate 220 that might otherwise occur.

II. Process for Manufacturing a Preferred Embodiment of the Present Invention

As previously mentioned, pedestal 120 (FIG. 2) of the ESC of the present invention may be fabricated using any number of materials such as molybdenum, ceramic materials, aluminum or stainless steel. Materials such as aluminum and stainless steel may be machined from a single piece. In the case of ceramic materials, ceramic to metal bonding techniques may be used, for example, to fabricate ceramic pedestals on a wire-mesh frame of molybdenum. Other materials may be fabricated from two or more pieces. An ESC is fabricated from two pieces for various reasons, such as when the interior channels cannot be drilled because of the material's brittleness, the material's composition or the shape of the cooling channels. Techniques such as electron beam welding may be used to bond the pedestal's two components. In a preferred embodiment, however, the pedestal of the present invention is fabricated from silicon billets. The silicon material used is doped to increase the material's conductance to between about $0.5\Omega$-cm and $5\Omega$-cm.

Silicon pedestal provides several advantages, one of which is the high purity level in which silicon is available. The purity of commercially available silicon is on the order of about 2 parts-per-billion. This reduces the amount of contaminants introduced into the processing chamber by diffusion and can therefore increase wafer yield. The silicon pedestal of the preferred embodiments is also attractive because of the low cost relative to silicon's purity, because of its ready availability and because the physical properties and characteristics of silicon are well understood.

Another advantage of the silicon pedestal used in preferred embodiments of the present invention is derived from the method in which the pedestal is manufactured. Preferably the pedestal is formed from two separate components similar to pedestals made from other materials as described above. The upper piece is then diffusion bonded to the lower piece in a process that produces minimal particulates and contaminants. Diffusion bonding does not form flashing or slag (both possible causes of particulates) as do the various welding methods used to bond materials such as molybdenum. Nor does diffusion bonding create chemical by-products that may result in chemical contamination as when the pedestal is formed by welding. Diffusion bonding does not require any foreign material (such as brazing alloys) to achieve the bond thus reducing the probability of any contamination.

Figure 5:
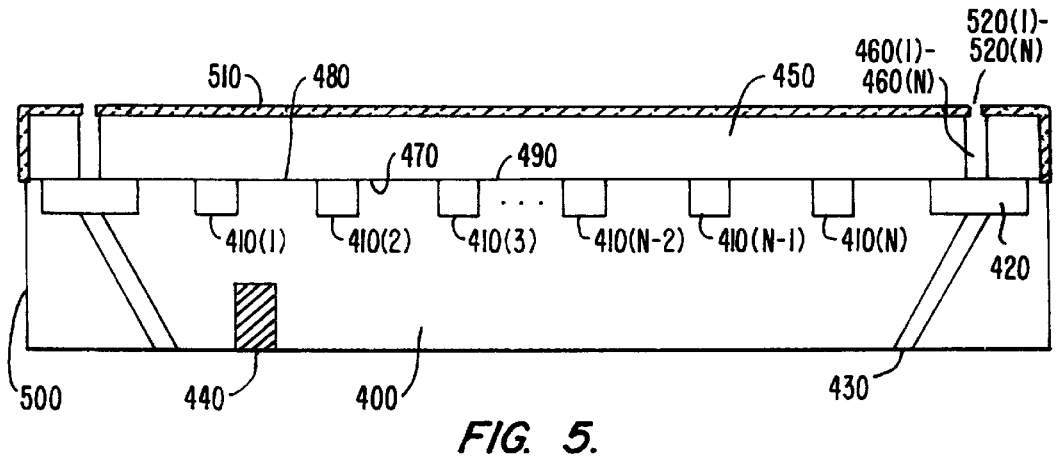
FIG. 5 is a vertical, cross-sectional view of a simplified, diamond-coated ESC that includes a diffusion-bonded silicon pedestal fabricated according to the sequence of steps illustrated in FIG. 4.
Figure 4:
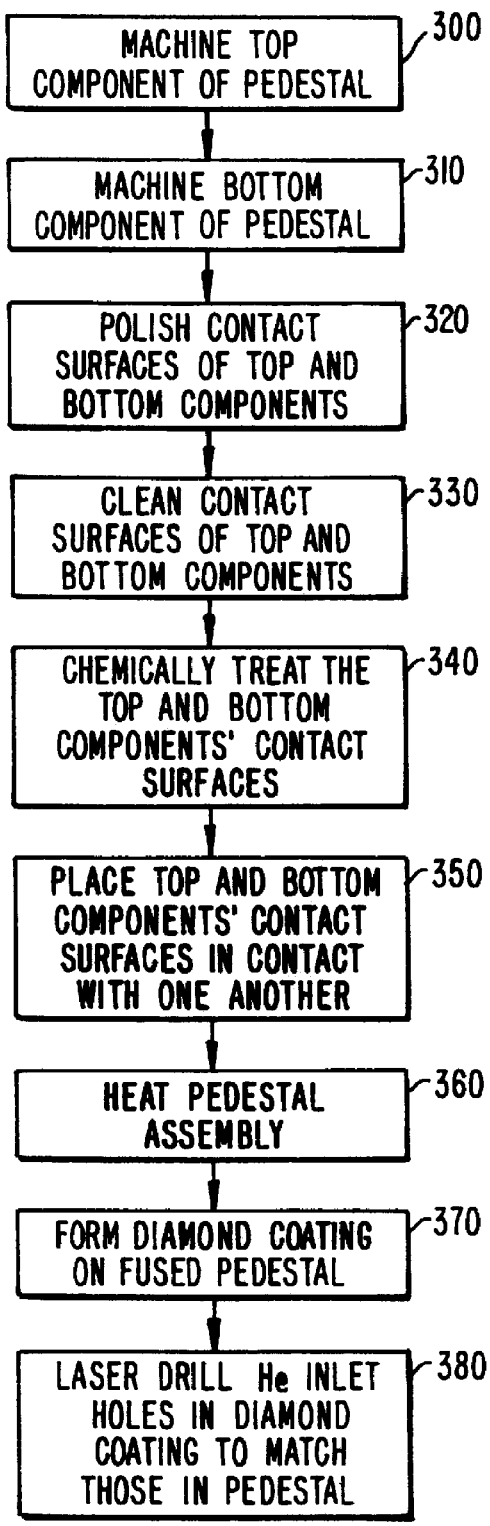
FIG. 4 is a flowchart showing the steps of the fabrication sequence for one embodiment of an ESC according to the present invention having a diffusion-bonded silicon pedestal.

FIG. 4 is a flowchart illustrating the steps of fabricating a diamond-coated silicon ESC according to the present invention, while FIG. 5 is a cross-sectional view of an ESC fabricated according to the steps of FIG. 4. For convenience and ease of reference, the discussion of FIG. 4 refers to components shown in FIG. 5, as appropriate. In FIG. 4, a pedestal 500 is fabricated from two pieces of silicon, shown in FIG. 5 as a silicon bottom component 400 and a silicon top component 450. In step 300, silicon top component 450 is drilled to provide helium holes 460(1)–(N). In Step 310, silicon bottom component 400 is machined to incorporate water coolant channels 410 (1)–(N), helium channels (exemplified by helium channel 420) and an electrical connection slot 440 by which the clamping voltage is applied. One or more helium inlets (exemplified by helium inlet 430) are also drilled into silicon bottom component 400 at this point. Certain features are formed by machining due to the silicon's brittleness and the shape of the passages to be formed. Employing currently available technology, passages in silicon may only be drilled up to about one inch in length before problems with shattering are encountered. Passages such as helium holes 460(1)–(N) may be mechanically drilled into silicon top component 450 due to their relatively short lengths. Passages such as water coolant channels 410 (1)–(N), however, are machined into silicon bottom component 400 because of their comparatively long lengths using, for example, a diamond saw or laser. Moreover, advantageous channel geometries are made possible by this two-piece fabrication technique. Laser, mechanical or other machining of silicon bottom component permits the creation of complex coolant channel patterns to improve thermal uniformity during substrate processing.

Silicon bottom component 400 and silicon top component 450 are then diffusion bonded together as described in steps 320–360. In Step 320, a top contact surface 470 of silicon bottom component 400 and a bottom contact surface 480 of silicon top component 450 are polished flat using a technique such as chemical-mechanical polishing. In Step 330, top contact surface 470 and bottom contact surface 480 are cleaned using procedures similar to those used in cleaning substrates prior to processing. For example, the surfaces may be acid-cleaned by creating a hydrophilic layer on each surface and then etching away this layer (and contaminants residing thereon) with an acid such as HF. In Step 340, top contact surface 470 and bottom contact surface 480 are made hydrophilic by treatment with, for example, a hydrogen peroxide solution.

In step 350, top contact surface 470 and bottom contact surface 480 are brought into contact. While the top and bottom surfaces 470 and 480 are in contact, silicon top component 450 and silicon bottom component 400 are heated to a temperature in excess of about 1000° C. to form pedestal 500 (step 360). Pedestal 500 is maintained at the high temperature for 2 to 4 hours in a flowing oxygen atmosphere. During the heating step, silicon atoms diffuse between top contact surface 470 and bottom contact surface 480. Such diffusion results in a diffusion bond 490 between the two components.

The formation of pedestal 500 is basically completed after step 360. As completed, the pedestal includes enclosed water coolant channels 410(1)–(N) and a helium channel 420. Formation of coolant channels 410(1)–(N) and helium channel 420 by separately machining the upper and lower components and then bonding the components together per the described diffusion bonding process is preferred over a process that mechanically drills the channels in a single silicon billet. Mechanically drilling such channels and passages in a single billet increases the risk of shattering the billet, especially as the passages being drilled become longer than about one inch (as previously discussed). Machining an exposed surface is thus less likely to cause such shattering and permits the creation coolant channel patterns of greater complexity than would otherwise be possible.

At step 370, pedestal 500 is then coated with either an insulating or conducting diamond film 510 as previously described. Diamond coating 510 is preferably between about 5 $\mu$m and 50 $\mu$m in thickness. In Step 380, helium holes 520(1)–(N) are laser drilled in the diamond coating to coincide with helium holes 460(1)–(N) in the silicon pedestal. Helium channels (not shown) are also machined into diamond coating 510 to allow the distribution of helium under the substrate, which promotes uniform temperature across the substrate during processing. These channels can be machined mechanically or by a method such as laser machining.

III. Experimental Results

The ESC of the present invention resists chemical attack, including attack by ionized gaseous species. Experiments were performed testing the resistance to such attacks at temperatures up to about 600° C. for an undoped diamond coating deposited by the above-described HFCVD method. The results of these experiments indicate that such a diamond coating resists attack by molecular and atomic oxygen, molecular and activated etch gases such as $NF_3$ and $CF_4$, and other process gases commonly used in substrate processing at temperatures of up to 600° C. Thus, an ESC according to the present invention can be heated to temperatures in excess of 600° C. in 100% flowing oxygen environments without experiencing oxidation. This is an extreme scenario, as such conditions are virtually never approached during normal processing. Tests conducted in an atomic oxygen environment display similar results.

Figure 6A:
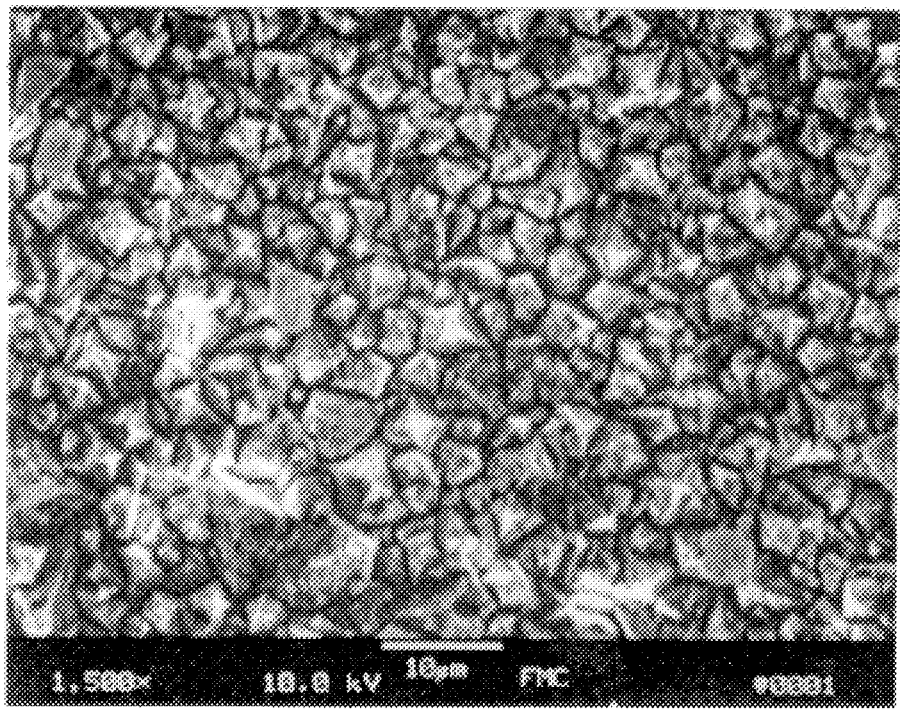
FIG. 6A is a scanning electron micrograph at 1500× magnification showing the surface structure of a diamond film deposited according to one embodiment of the present invention prior to plasma treatment.
Figure 6B:
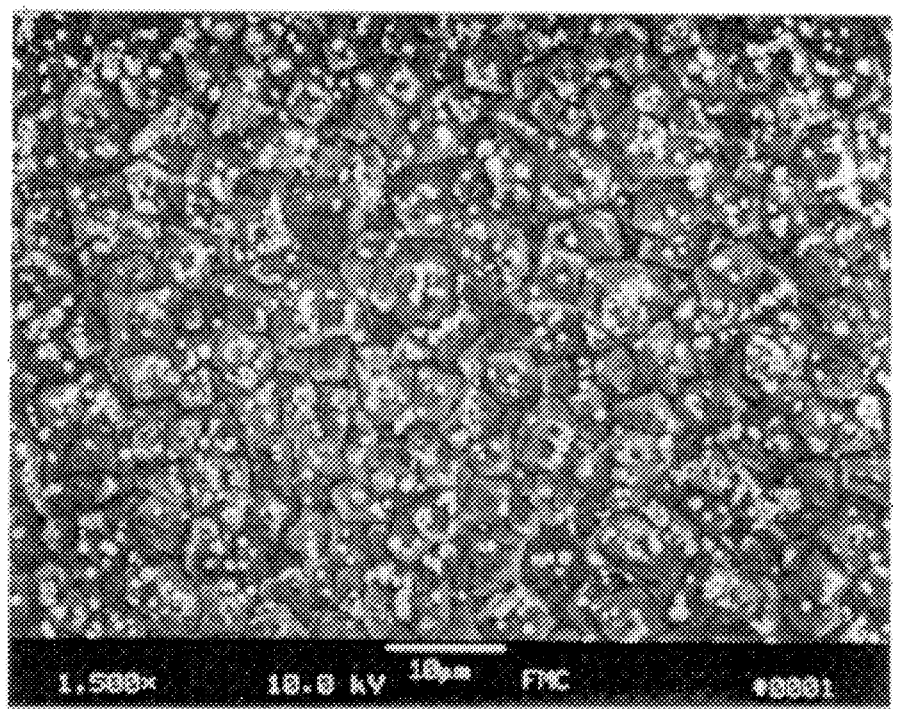
FIG. 6B is a scanning electron micrograph at 1500× magnification showing the effects of an $NF_3$ plasma treatment on the surface structure of the diamond film shown in FIG. 6A.
Figure 6C:
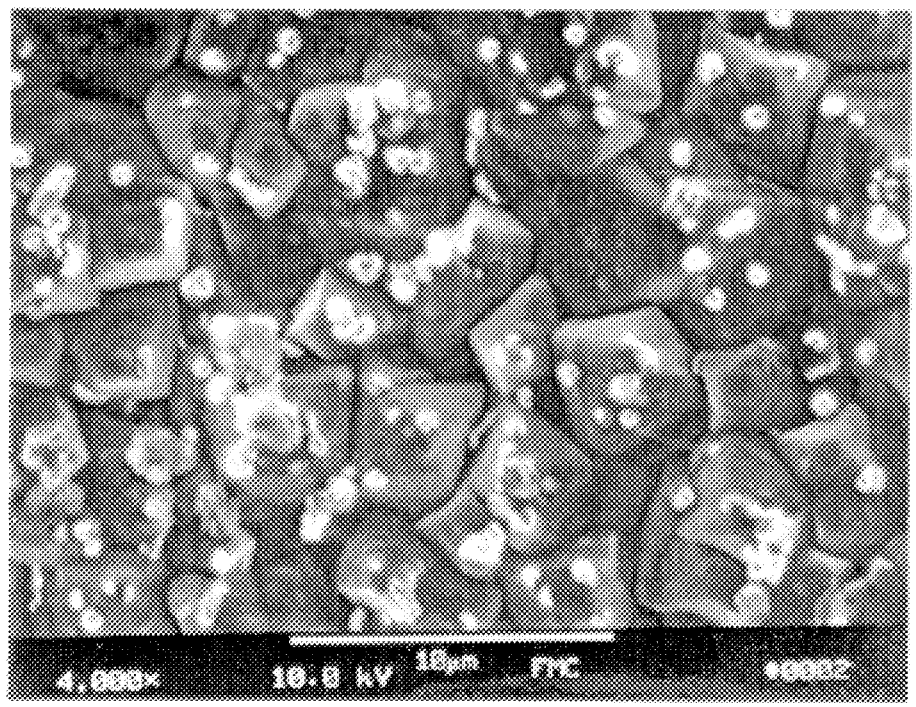
FIG. 6C is a scanning electron micrograph at 4000× magnification showing the effects of an $NF_3$ plasma treatment on the surface structure of the diamond film shown in FIG. 6A.

FIG. 6A shows the surface structure of an undoped diamond coating which was the subject of another experiment. The coating in the figure was deposited using HFCVD methods on a silicon coupon to a thickness of approximately 5 $\mu$m and is shown at 1500× magnification. The coated silicon coupon was placed on a silicon substrate, which was then held in place by an ESC. FIG. 6B shows the coating after 10 hours exposure to a $CF_4/O_2$ plasma with bias RF power of approximately 4000 Watts and source RF power of approximately 2500 Watts. Magnification is again 1500×. FIG. 6C illustrates a scanning electron micrograph showing a higher magnification view (4000×) of the same sample. The coating's surface structure shows no evidence of etching after exposure to the $CF_4/O_2$ plasma in either photomicrograph. The white precipitates seen in the photomicrographs of FIGS. 6B and 6C are aluminum fluoride deposits resulting from the reaction of the aluminum chamber walls with the fluorine in the plasma.

The method of the present invention is not intended to be limited in any manner by the specific parameters set forth in the above experiments. A person of ordinary skill in the art will realize that different processing conditions and coating methods can be used without departing from the spirit of the invention.

Having fully described several embodiments of the present invention, many other equivalent or alternative types of diamond coatings according to the present invention will be apparent to those skilled in the art. These equivalents and alternatives are intended to be included within the scope of the present invention.

What is claimed is:

1. An electrostatic chuck for supporting a substrate in a processing chamber during processing, said electrostatic chuck comprising:

an electrically conductive element having an upper surface; and a doped diamond layer overlying said upper surface, said doped diamond layer having a substantially planar surface, opposite said upper surface, for receiving said substrate said doped diamond layer being doped with a dopant such that a conductance of said doped diamond layer is increased.

2. The electrostatic chuck of claim 1, wherein an average distance between a first point of contact adjacent to a second point of contact is between about 0.1 $\mu$m and 2 $\mu$m, said first and said second points of contact being between said doped diamond layer and said substrate.

3. The electrostatic chuck of claim 2, wherein said substantially planar surface possesses a uniformly even surface.

4. The electrostatic chuck of claim 2, wherein said dopant is boron.

5. The electrostatic chuck of claim 2, wherein said substantially planar surface exhibits a variation in height of 2.5 $\mu$m or less.

6. The electrostatic chuck of claim 2, wherein said electrically conducting element comprises upper and lower silicon components bonded together by diffusion.

7. The electrostatic chuck of claim 6, wherein said lower silicon component has coolant channels machined into an upper surface and wherein said upper surface is diffusion bonded to said upper silicon component.

8. The electrostatic chuck of claim 1, wherein said conductance is between about 3$\Omega$-cm and 50$\Omega$-cm.

9. A substrate processing system that includes the electrostatic chuck of claim 1.

10. A process for fabricating a pedestal for supporting a substrate in a substrate processing chamber, an electrically conductive element, said electrically conductive element having a substantially planar surface, above which said substrate rests, comprising the steps of:

machining a first silicon billet to form a lower component of said pedestal;

machining a second silicon billet to form an upper component of said pedestal;

machining coolant channels into a first facing surface of one of said upper and said lower components; and forming a diffusion bond between said first facing surface and a second facing surface of another one of said upper and said lower components.

11. The process of claim 10, further comprising the steps of machining a helium channel in said lower component and drilling holes in said upper component such that said holes are communicatively coupled to said helium channel when said upper and lower components are diffusion bonded together.

12. The process of claim 11, further comprising the step, performed before forming said diffusion bond, of polishing said first and said second facing surfaces.

13. The process of claim 12, wherein said step of polishing said bottom surface comprises the steps of:

mechanically polishing said first facing surface; and chemically treating said first facing surface.

14. The process of claim 13, wherein said step of chemically treating said first facing surface causes said first facing surface to become hydrophilic.

15. The process of claim 12, wherein said step of polishing said top surface comprises the steps of:

mechanically polishing said second facing surface; and chemically treating said second facing surface.

16. The process of claim 15, wherein said step of chemically treating said second facing surface causes said second facing surface to become hydrophilic.

17. The process of claim 12, wherein said step of forming said diffusion bond comprises the steps of:

placing said first facing surface in contact with said second facing surface; and heating said top component and said bottom component to a temperature of at least about 1000° C.

18. The process of claim 12, further comprising the step of depositing a diamond film over an upper portion of said upper component after said step of forming said diffusion bond.

19. The process of claim 18, further comprising the step of laser drilling holes in said diamond film corresponding to said holes drilled in said upper component.

20. The process of claim 18, wherein said diamond film is doped with boron to increase the conductance of said diamond film and possesses a uniformly uneven surface.

21. A process for fabricating a pedestal for supporting a substrate in a substrate processing chamber, an electrically conductive element, said electrically conductive element having a substantially planar surface, above which said substrate rests, comprising the steps of:

machining a first silicon billet to form a lower component of said pedestal;

machining a second silicon billet to form an upper component of said pedestal;

machining coolant channels into a first facing surface of one of said upper and said lower components;

machining a gas channel in said lower component and drilling holes in said upper component such that said holes are communicatively coupled to said gas channel when said upper and lower components are diffusion bonded together; and forming a diffusion bond between said first facing surface and a second facing surface of another one of said upper and said lower components.

22. A process for fabricating a pedestal for supporting a substrate in a substrate processing chamber, an electrically conductive element, said electrically conductive element having a substantially planar surface, above which said substrate rests, comprising the steps of:

machining a first silicon billet to form a lower component of said pedestal;

machining a second silicon billet to form an upper component of said pedestal;

machining coolant channels into a first facing surface of one of said upper and said lower components;

machining a gas channel in said lower component and drilling holes in said upper component such that said holes are communicatively coupled to said gas channel when said upper and lower components are diffusion bonded together;

polishing said first facing surface;

polishing a second facing surface of another one of said upper and said lower components;

forming a diffusion bond between said first and said second facing surfaces;

depositing a diamond film over an upper portion of said upper component after said step of forming said diffusion bond; and laser drilling holes in said diamond film corresponding to said holes drilled in said upper component.

23. The process of claim 22, wherein said diamond film is doped with boron to increase the conductance of said diamond film and possesses a uniformly uneven surface.

* * * * *